US010875766B2

(12) United States Patent
Acosta et al.

(10) Patent No.: US 10,875,766 B2
(45) Date of Patent: Dec. 29, 2020

(54) HIGH THROUGHPUT CHARACTERIZATION OF INDIVIDUAL MAGNETIC NANOPARTICLES

(71) Applicant: STC.UNM, Albuquerque, NM (US)

(72) Inventors: Victor Acosta, Albuquerque, NM (US); Andrejs Jarmola, Albany, CA (US)

(*) Notice: Subject to any disclaimer, the term of this patent is extended or adjusted under 35 U.S.C. 154(b) by 0 days.

(21) Appl. No.: 16/343,590

(22) PCT Filed: Oct. 27, 2017

(86) PCT No.: PCT/US2017/058786
§ 371 (c)(1),
(2) Date: Apr. 19, 2019

(87) PCT Pub. No.: WO2018/081577
PCT Pub. Date: May 3, 2018

(65) Prior Publication Data
US 2020/0048084 A1 Feb. 13, 2020

Related U.S. Application Data

(60) Provisional application No. 62/414,602, filed on Oct. 28, 2016.

(51) Int. Cl.
*B82Y 35/00* (2011.01)
*B82B 3/00* (2006.01)
*G01N 15/10* (2006.01)
*G01R 33/12* (2006.01)
*G01N 15/00* (2006.01)

(52) U.S. Cl.
CPC ............ *B82Y 35/00* (2013.01); *B82B 3/009* (2013.01); *G01N 15/1031* (2013.01); *G01R 33/1223* (2013.01); *G01R 33/1269* (2013.01); *G01R 33/1276* (2013.01); *G01N 2015/0038* (2013.01)

(58) Field of Classification Search
CPC .... B82Y 35/00; B82B 3/009; G01N 15/1031; G01N 2015/0038; G01R 33/1223; G01R 33/1269; G01R 33/1276
USPC ........................................................ 250/251
See application file for complete search history.

(56) References Cited

U.S. PATENT DOCUMENTS 5,912,777 A 6/1999 Jaworske
2010/0135890 A1 6/2010 Boudou et al.

FOREIGN PATENT DOCUMENTS

WO WO-2008123844 A2 10/2008
WO WO-2010103419 A1 9/2010

OTHER PUBLICATIONS

Le Sage et al., "Optical Magnetic Imaging of Living Cells", Nature, vol. 496, pp. 486-490 (Year: 2013).*

(Continued)

*Primary Examiner* — Nicole M Ippolito
(74) *Attorney, Agent, or Firm* — Schwegman Lundberg & Woessner, P.A.

(57) ABSTRACT

Technologies related to parallel characterization of individual MNPs are disclosed. A diamond chip with MNPs distributed thereon may be used with an epifluorescence microscope and camera to generate multiple different images of multiple individual MNPs. The multiple images are recorded at different microwave frequencies and under different external magnetic field strengths. The multiple images are then used to determine properties of the multiple individual MNPs.

17 Claims, 9 Drawing Sheets

(56) References Cited

OTHER PUBLICATIONS

"International Application Serial No. PCT/US2017/058786, International Search Report dated Feb. 28, 2018", 2 pgs.
"International Application Serial No. PCT/US2017/058786, Written Opinion dated Feb. 28, 2018", 5 pgs.
Le Sage, D., et al., "Optical magnetic imaging of living cells", Nature, vol. 496, (Apr. 25, 2013), 486-489.

* cited by examiner

HIGH THROUGHPUT CHARACTERIZATION OF INDIVIDUAL MAGNETIC NANOPARTICLES

CROSS REFERENCE TO RELATED APPLICATION

This application is a U.S. National Stage Filing under 35 U.S.C. 371 from International Application No. PCT/US2017/058786, filed on Oct. 27, 2017, and published as WO 2018/081577 on May 3, 2018, which application claims the benefit of U.S. Provisional Application No. 62/414,602, filed on Oct. 28, 2016, entitled "OPTICAL MAGNETIC MICROSCOPE AND MEASUREMENT METHODS," which applications and publications are incorporated by reference in their entirety.

STATEMENT OF GOVERNMENT SUPPORT

This invention was made in part with Government support under Project Number 1R41MH115884-01 awarded by the U.S. Dept. of Health and Human Services, National Institutes of Health (NIH). The government has certain rights in this invention.

BACKGROUND

Magnetic nanoparticles (MNPs) are widely used for applications in biomedical imaging, diagnostics, and therapeutics, environmental remediation, and new frontiers in materials nanotechnology. However, MNP manufacturing is notoriously lacking in quality control. It is plagued by reproducibility problems, inaccurate specifications, and a lack of common practices. Advanced characterization tools are often either inaccessible (due to cost, maintenance, etc.) or simply do not exist. Most notably, tools for quantitative magnetic measurements of individual nanoparticles are absent, aside from specialized equipment in a few research laboratories. If the cost, size, accuracy, versatility, and throughput of these instruments can be substantially improved they could have a dramatic impact on the field.

SUMMARY

An apparatus and method for high throughput characterization of individual Magnetic Nanoparticles (MNPs) is disclosed. In some examples, the apparatus may comprise a diamond chip doped with a layer of nitrogen vacancy (NV) color centers; one thousand or more MNPs distributed either on the diamond chip or on a substrate layer on the diamond chip; a laser generator to direct a laser beam at the diamond chip; a controllable-frequency microwave antenna positioned proximal to the MNPs; a controllable-strength magnetic field generator positioned to generate a magnetic field at the MNPs; and a camera to record fluorescence images, of fluorescence generated by the NV color centers in response to stimulation by the laser beam. The fluorescence recorded in fluorescence images is modulated by magnetic resonance of the MNPs. The magnetic resonance is responsive to stimulation by the controllable-frequency microwave antenna under the magnetic field generated by the controllable-strength magnetic field generator. The controllable-frequency microwave antenna and controllable-strength magnetic field generator may be adjusted to acquire multiple fluorescence images, e.g., according to the methods described herein.

In some examples, methods for high throughput characterization of individual MNPs may comprise distributing one thousand or more MNPs on a diamond chip or on a substrate layer positionable on the diamond chip, wherein the diamond chip is doped with a layer of NV color centers; positioning the diamond chip and MNPs, or the substrate layer and MNPs, in an epifluorescence microscope, wherein the epifluorescence microscope comprises, e.g., the various elements described herein; and recording, by a camera coupled with the epifluorescence microscope, fluorescence images at multiple different microwave frequencies, wherein the fluorescence images record fluorescence modulated by magnetic resonance of the MNPs, wherein each fluorescence image comprises multiple pixels, and wherein at least a first pixel in each fluorescence image records fluorescence modulated by magnetic resonance of a first individual MNP, and wherein at least a second pixel in each fluorescence image records fluorescence modulated by magnetic resonance of a second individual MNP.

Furthermore, the fluorescence images at multiple different microwave frequencies may be used to create a magnetic field map, and isolated magnetic features may be identified in the magnetic field map in order to identify individual MNPs. Magnetization curves may be formed for the individual MNPs, as described herein, and the magnetization curves may be used to populate histograms of coercivity, remanent magnetization, or saturation magnetization of, e.g., the first individual MNP and/or the second individual MNP. Further aspects of the disclosed apparatus and methods are provided below.

BRIEF DESCRIPTION OF THE DRAWINGS

Various features and attendant advantages of the disclosed technologies will become fully appreciated when considered in conjunction with the accompanying drawings, in which like reference characters designate the same or similar parts throughout the several views, and wherein.

DETAILED DESCRIPTION

Figure 1:
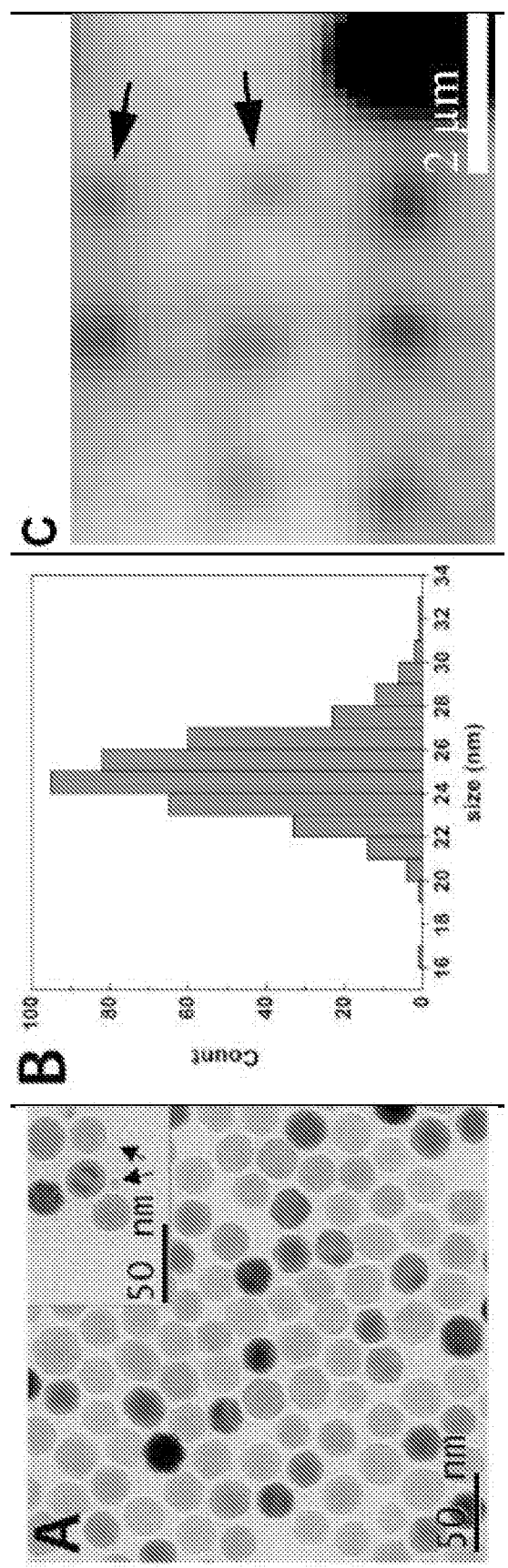
FIG. 1 illustrates example single MNP measurement techniques.

Prior to explaining embodiments of the invention in detail, it is to be understood that this disclosure is not limited to the details of construction or arrangements of the components and method steps set forth in the following description or illustrated in the drawings. Embodiments of this disclosure are capable of other embodiments and of being practiced and carried out in various ways. Also, it is to be understood that the phraseology and terminology employed herein are for the purpose of the description and should not be regarded as limiting.

In general, this disclosure provides technologies for parallel characterization of individual MNPs. The disclosed technologies make use of a diamond chip with MNPs distributed thereon, along with an epifluorescence microscope and camera, to generate multiple different images of multiple individual MNPs. The multiple images are recorded at different microwave frequencies and under different external magnetic field strengths. The multiple images are then used to determine properties of the multiple individual MNPs.

The magnetic properties of MNPs which may be characterized using the technologies disclosed herein include, e.g., saturation magnetization, coercivity, blocking temperature, and relaxation time. Many of these properties strongly depend on particle size, shape, composition, and shell-core structure. Accurate knowledge of these properties is particularly important for biomedical applications, as uniform magnetic properties can reduce the MNP doses and limiting toxicity to patients. For example, applications in biosensing, drug delivery, hyperthermia treatment, and clinical imaging such as magnetic resonance imaging (MRI) and magnetic nanoparticle imaging (MPI) would all benefit from uniform MNP probes. The technologies disclosed herein may be used to support manufacture of such uniform MNP probes, by better characterizing MNPs for applications in such probes.

Currently, the workhorse of single MNP measurements is the transmission electron microscope (TEM). TEM images can often reveal information about size, crystallinity, and shape at the individual MNP level. However ambiguities exist in extrapolating these images to predict magnetic properties. Therefore in some embodiments, the technologies disclosed herein may be used to address TEM measurement ambiguities, e.g., by correlating, at the individual particle level, measurements of magnetic moment, anisotropy, relaxation, etc., generated using the techniques disclosed herein, with particle size measurements from TEMs. Such applications of the disclosed technologies would be useful in quality control, where correlative TEM and magnetic measurements of individual MNPs can be used to determine composition and purity.

Another emerging area where direct measurement of magnetic properties of individual nanoparticles, according to this disclosure, is superior to TEM-based inference is in the use of super-paramagnetic MNPs (SP-MNPs), e.g., for biomedical applications. In applications such as MPI and hyperthermia treatment, an external Alternating Current (AC) magnetic field with frequency ω is used to flip MNP magnetic moments. Their magnetic response is maximal if ωτ=1, where r is the MNP relaxation rate. In magnetorelaxation imaging (MRX), the time-dependent magnetic response of SP-MNPs is used to eliminate background sources of magnetic field. These methods often exploit the fact that magnetized MNPs bound to larger objects relax on a timescale of milliseconds to minutes, while MNPs freely diffusing in fluids relax in microseconds; this feature enables selective addressing of MNPs bound to a biomarker of interest.

FIG. 1 illustrates data resulting from example single MNP measurement techniques. FIG. 1A illustrates a TEM micrograph of SP-MNPs, with an inset showing a subset of particles with small diameter. FIG. 1B illustrates a size distribution profile obtained from TEM analysis of 400 MNPs. FIG. 1C illustrates room temperature detection of individual 20-nm SP-MNPs using a diamond magnetic microscope.

Figure 2:
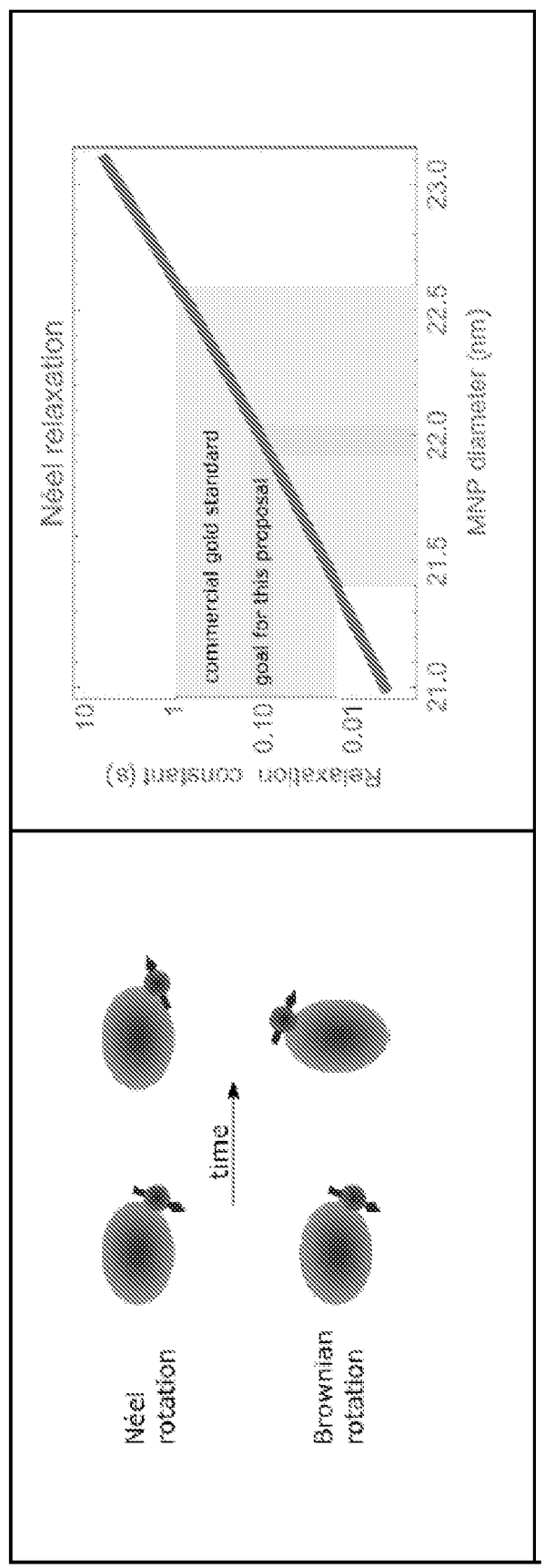
FIG. 2 illustrates example SP-MNP relaxation.

FIG. 2 illustrates example SP-MNP relaxation. Magnetic relaxation mechanisms are illustrated on the left side of FIG. 2. Illustrated at right is dependence of Néel relaxation on core diameter for MNPs with anisotropy constant=18700 J/m Ka 3 and T=300 K.

Relaxation of SP-MNP magnetization after switching off an external magnetic field occurs due to (i) physical rotation of the particles due to Brownian fluctuations or (ii) spontaneous flipping of the SP-MNP magnetic moment without motion (Néel relaxation), FIG. 2. The first process depends linearly on the hydrodynamic volume of a nanoparticle, while the second process depends exponentially on the magnetic particle core volume. FIG. 2 shows Néel relaxation constant as a function of magnetic core diameter. State-of-the-art commercial 22 nm MNPs exhibit a variation of only ~0.6 nm in diameter. Nonetheless they exhibit orders of magnitude variation in relaxation times (grey area), owing to the exponential dependence on volume.

Such a large variance in magnetic properties has a direct negative impact on applications, as much higher MNP doses (in some cases orders-of-magnitude higher) must be delivered to patients than are actually addressed. It also presents a challenge for quality control. Quantitatively characterizing these broad distributions is difficult from ensemble measurements alone, as they typically require assumptions-laden models and highly sensitive tools. Understanding and controlling these inhomogeneities will first require new methods for routine quantitative magnetic characterization of individual nanoparticles. The teachings of this disclosure provide such new methods.

Figure 3:
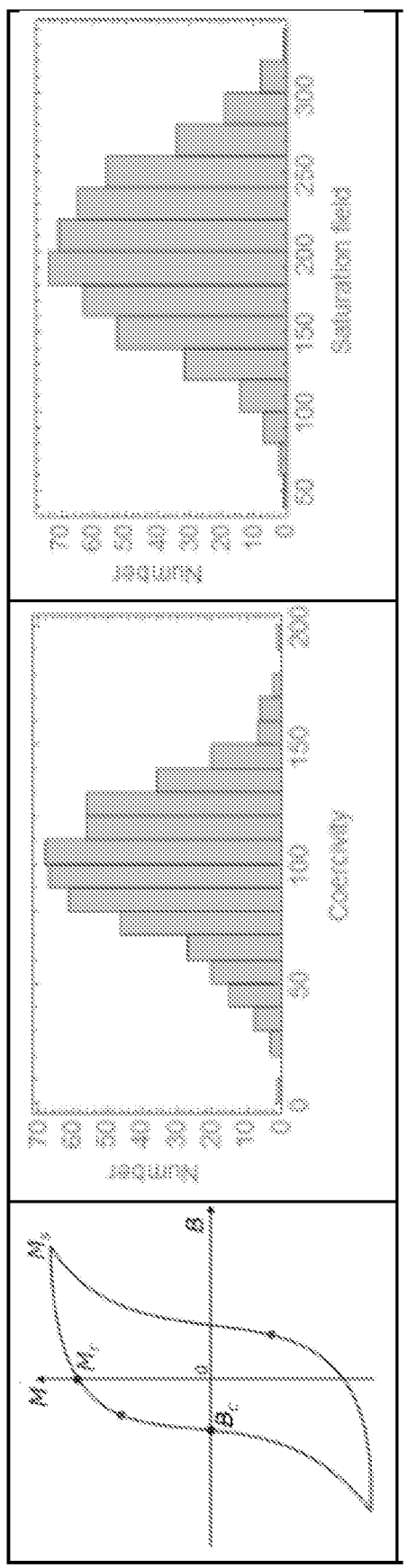
FIG. 3 illustrates example ideal single-MNP characterization.

FIG. 3 illustrates example ideal single-MNP characterization. At left, FIG. 3 illustrates magnetization curves acquired for each MNP, revealing critical parameters: coercivity Bc, remanent magnetization Mr, and saturation magnetization Ms. At middle and right, FIG. 3 illustrates histograms of each parameter, which are populated by measurements on many single MNPs.

Our ideal magnetic characterization tool would operate at room temperature as follows. Standard magnetic response measurements such as magnetization curves would be acquired from a large number (>1000) of MNPs in a few minutes or less. From these hysteresis loops, histograms would be populated of relevant properties such as coercivity, remanent magnetization, and saturation magnetization. Add-ons to this base model would include time-dependent relaxation measurements for SP-MNPs and temperature dependence measurements for fundamental studies. This will involve a versatile magnetometry platform. Here we disclose optical magnetic microscopy on a diamond chip as a suitable platform that can operate in a wide temperature range (0-600 K) with sufficient sensitivity to characterize MNPs of 10 nm core diameter or less. In some embodiments, the device may measure magnetic moments of MNPs with core diameter <20 nm.

Figure 4:
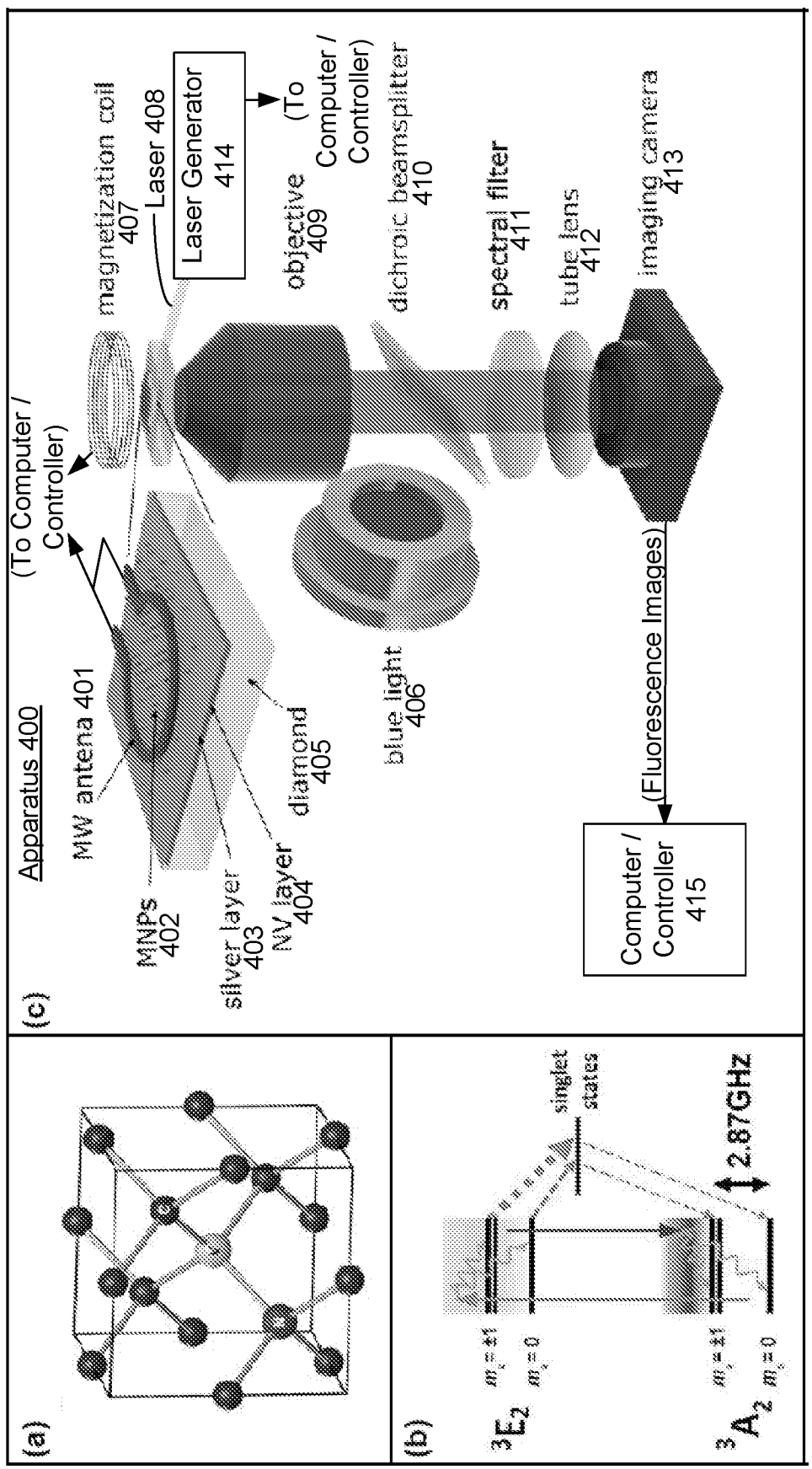
FIG. 4 illustrates an example optical magnetic microscope.

FIG. 4 illustrates an example apparatus for high throughput characterization of individual MNPs according to this disclosure. The apparatus 400 generally includes the diamond chip 405 with MNPs 402 distributed thereon, which is enlarged in FIG. 4(c), positioned within an epifluorescence microscope. The term "epifluorescence microscope" is generally used herein to refer to any microscope which measures properties of a sample (e.g., MNPs 402) by measuring fluorescence of a nearby material (e.g., the NV color centers in NV layer 404), as modulated by the sample. The epifluorescence microscope illustrated in FIG. 4(c) includes an example set of elements, however it will be appreciated that various elements may be eliminated, modified or replaced in other epifluorescence microscopes.

FIG. 4(a) illustrates a lattice structure of an example diamond chip 405 which may be used in the disclosed apparatus 400, the lattice structure comprising NV color centers, as described herein. FIG. 4(b) illustrates an energy-level schematic of the NV center shown in FIG. 4(a). FIG. 4(c) illustrates the example apparatus 400, including the diamond chip 405 having a lattice structure an NV centers such as illustrated in FIGS. 4(a) and 4(b).

The apparatus 400 illustrated in FIG. 4(c) includes the diamond chip 405 doped with a layer 404 of NV color centers. The layer 404 of NV color centers may be, e.g., about 200 nanometers thick. In the illustrated embodiment, a protective layer, referred to as silver layer 403 is also deposited on the diamond chip 405, over the NV layer 404. The protective layer 403 may comprise, e.g., silver and/or sapphire layers as discussed herein. One thousand or more MNPs 402 are also distributed on the diamond chip 405 (or on the protective layer 403, which may be considered as part of the diamond chip 405). While the MNPs 402 are illustrated as distributed on the diamond chip 405 in FIG. 4(c), in some embodiments, MNPs 402 may be distributed on a substrate layer on the diamond chip 405. An example substrate layer on the diamond chip 405, upon which the MNPs 402 may be distributed, is illustrated in FIG. 9(b).

The disclosed apparatus 400 and methods are capable of parallel characterization of large numbers, e.g., thousands, of MNPs 402. While characterization of one thousand or more MNPs 402 is considered as particularly advantageous, this disclosure is not necessarily limited to measurement of any particular number of MNPs. The measurement of one or more MNPs according to the techniques described herein is within the scope of the present disclosure.

The apparatus illustrated in FIG. 4(c) furthermore includes a controllable-frequency microwave antenna 401 positioned proximal to the MNPs 402. The microwave antenna 401 may be coupled with a control apparatus such as computer/controller 415, as will be appreciated. A laser generator 414 may direct a laser beam 408 at the diamond chip 405. The laser beam 408 may comprise, e.g., a laser beam with a wavelength in the range of 500-600 nanometers (nm), such as 520 nm or 532 nm, directed at a side of the diamond chip 405 at a glancing angle, as discussed herein. The laser generator 414 may be coupled with a control apparatus such as computer/controller 415, as will be appreciated. A controllable-strength magnetic field generator, referred to as magnetization coil 407, is positioned to generate a magnetic field at the MNPs 402. The magnetization coil 407 may be coupled with a control apparatus such as computer/controller 415, as will be appreciated. In some embodiments, the magnetization coil 407 may be adapted to generate a magnetic field between ±200 milliteslas (mT), as described herein.

The apparatus illustrated in FIG. 4(c) furthermore includes an objective 409, a blue light 406, a dichroic beamsplitter 410, a spectral filter 411, a tube lens 412, and an imaging camera 413. Some of these elements may optionally be omitted or modified in some embodiments, as will be appreciated.

The camera 413, optionally in conjunction with a computer/controller 415 coupled with camera 413, records fluorescence images, of fluorescence generated by the NV color centers in NV layer 404 in response to stimulation by the laser beam 408. The fluorescence recorded in a fluorescence image is modulated by magnetic resonance of the MNPs 402, and the magnetic resonance of the MNPs 402 is responsive to stimulation by the controllable-frequency microwave antenna 401 under the magnetic field generated by the controllable-strength magnetic field generator 407. In some embodiments, the camera 413 may comprise a sCMOS camera, although other camera types are also available as will be appreciated.

In FIG. 4, the NV layer 404 may contain billions of NV centers, and each NV center serves as a tiny magnetic-field sensor by optically detecting changes in the NV energy levels. By interrogating the NV sensing layer 404 with laser beam 408 and microwaves (MW) from MW antenna 401, the magnetic fields from the MNPs 402 become encoded in the NV fluorescence signal and imaged onto an image sensor in camera 413. Analysis of a series of fluorescence images recorded at different MW frequencies reveals the magnetic field distribution from each individual MNP. By taking a series of magnetic field images at various magnetic field strengths (produced by magnetization coil 407) and directions (e.g., by reorienting and/or displacing magnetization coil 407), hysteresis loops and magnetic anisotropies of individual MNPs can be determined. By pulsing the magnetic field produced by magnetization coil 407, the MNP relaxation properties can be determined.

While MW antenna 401, magnetization coil 407, laser generator 414, and camera 413 are illustrated as coupled with computer/controller 415 in FIG. 4(c), it will be appreciated that in some embodiments, separate computers/controllers may control one or more of the illustrated elements. Furthermore, computer/controller 415 may include a processor, memory, and computer readable instructions to control measurements by the apparatus 400, according to the techniques described herein, including recording fluorescence images from camera 413 and processing the images as described in connection with FIG. 5.

Figure 5:
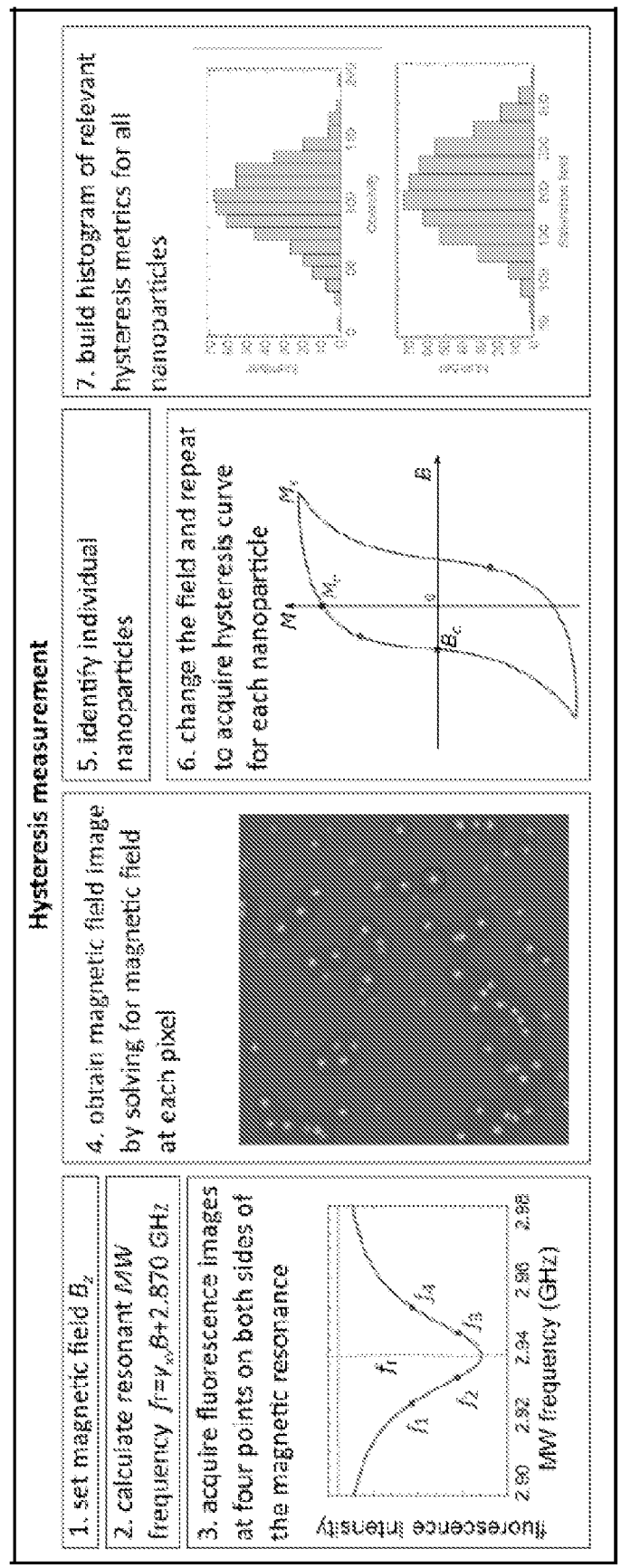
FIG. 5 illustrates an example measurement protocol.

FIG. 5 illustrates an example method for high throughput characterization of individual MNPs, in accordance with at least some embodiments of the present disclosure. The method illustrated in FIG. 5 makes use of an apparatus 400 such as illustrated in FIG. 4. Using techniques such as illustrated in FIG. 5, the apparatus 400 may perform parallel characterization of thousands of individual MNPs. Unlike existing techniques for individual MNP characterization, techniques according to this disclosure work at ambient conditions and offer high throughput (e.g., >1000 individual particles per 10 min).

With reference to FIG. 4 and FIG. 5, an example measurement protocol may include the following operations:

1. MNPs 402, e.g., one thousand or more MNPs, may be distributed on a diamond chip 405 or on a substrate layer positionable on the diamond chip 405, wherein the diamond chip 405 is doped with a layer of NV color centers. The diamond chip 405 and MNPs 402 may then be positioned in an epifluorescence microscope, e.g., at the focus of the epifluorescence microscope as illustrated in FIG. 4(a). In embodiments in which MNPs are distributed on the substrate layer positionable on the diamond chip 405, the substrate layer may be positioned on a diamond chip existing in the epifluorescence microscope. The epifluorescence microscope comprises a camera 413 or is coupled with a camera 413. The distributed MNPs 402 may comprise numerous isolated MNPs, e.g., MNPs which are generally some average distance apart from one another. A first magnetic field strength may be set for fluorescence images to be acquired, using an electromagnet such as magnetization coil 407 with an example range $B_{max} \approx \pm 200$ mT, along one of four possible NV crystallographic orientations (FIG. 4a). Depending on the cut of the diamond crystal 405, this can correspond to an in-plane or out-of-plane direction (see step 4).

2. A resonant microwave frequency fr of the MNPs 402 may be calculated. The magnetic field produces a Zeeman splitting in the NV spin sublevels. The frequency of the microwave transition between two spin levels is fr=γNVB+2.870 GHz.

3. Multiple fluorescence images, e.g., two or more fluorescence images, may be recorded/acquired using the camera 413. The fluorescence images may be acquired at multiple different microwave frequencies produced by MW antenna 401. The multiple different microwave frequencies may comprise microwave frequencies above and below the resonant microwave frequency fr. The fluorescence images record fluorescence modulated by magnetic resonance of the MNPs 402. Each fluorescence image comprises multiple pixels, and at least a first pixel in each fluorescence image records fluorescence modulated by magnetic resonance of a first individual MNP, while at least a second pixel in each fluorescence image records fluorescence modulated by magnetic resonance of a second individual MNP, and so on for all, or a potentially large number of the MNPs 402. Due to a combination of optical polarization and spin-selective fluorescence, FIG. 4(*b*), fr can be determined by optically-detected magnetic resonance (ODMR). This involves controlling MW antenna 401 to sweep the microwave field frequency about fr, applying the laser beam 408, and recording the resulting fluorescence, e.g. at camera 413. Specifically, in one example embodiment, four different microwave frequencies may be used, and the fluorescence coming from the NV layer 404 at each frequency may be recorded in a fluorescence image. From the resulting four images recorded at camera 413, we infer fr, and thus the local magnetic field, in each pixel.

4. From the fluorescence images generated in step 3, we create a magnetic field map. The magnetic field map may be created, e.g., by processing fluorescence images at computer/controller 415. Most voxels contain NV centers that are not nearby any MNPs and thus detect the same background field. Meanwhile, NV voxels near an MNP exhibit a shifted magnetic field. If the MNP axis points in an in-plane direction, a dipole-like pattern appears about each MNP, as in FIG. 6. If the MNP axis is purely out of plane, the MNP fields appear circularly symmetric, similar to in an optical image, and exhibit the maximum possible Zeeman shift. Analysis of the magnetic-feature patterns can be used to identify magnetic anisotropy parameters.

5. By identifying isolated magnetic features in the magnetic field maps, individual MNPs may be identified. The magnetic field maps can be correlated with reflectance images of blue LED light 406 to verify that magnetic features have corresponding scattering sites at their center. Correlative SEM or TEM imaging may be used to further resolve very small MNPs and MNP clusters which are smaller than the optical microscope diffraction limit.

6. The magnetic field strength at the MNPs 402 may be modified, e.g., by changing position and/or field strength produced at magnetization coil 407, and additional fluorescence images may be recorded. The first fluorescence images (produced under the first external magnetic field) and the additional fluorescence images (produced under a modified external magnetic field) may be used to form magnetization curves for the individual MNPs, e.g., the first individual MNP and the second individual MNP, as well as all, or a potentially large number of the MNPs 402. In some embodiments, the external magnetic field produced by magnetization coil 407 may be swept in small increments between ±Bmax, where Bmax may be, e.g., between 20-200 mT, depending on the type of MNP. At each field strength, a magnetic field map may be is produced and the magnetic field from each MNP may be recorded (steps 4-5). From these data, magnetization curves may be formed for each MNP in the field of view.

7. From the magnetization curves produced in step 6, histograms of critical parameters such as coercivity, remanent magnetization, saturation magnetization are populated for each individual MNP, e.g., for the first individual MNP, the second individual MNP, and/or any of the other MNPs 402.

Figure 6:
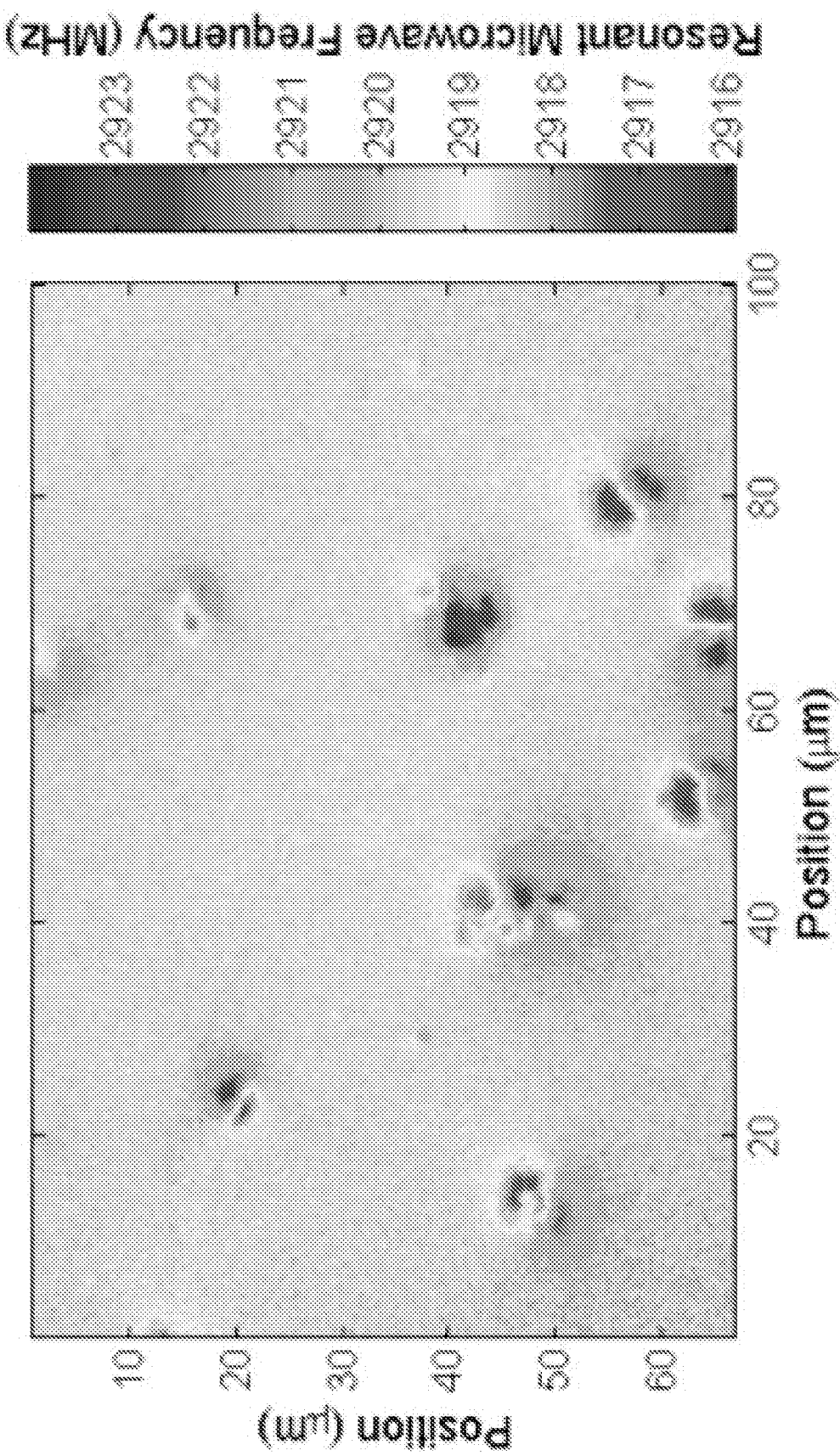
FIG. 6 illustrates example data such as may result from application of the measurement techniques disclosed herein.

FIG. 6 illustrates example magnetic field map data such as may result from application of the measurement techniques disclosed herein. FIG. 6 includes an image of a magnetic field projection along a diamond crystallographic axis (normal to the surface) in a small 2 mT bias field. The dipole fields from individual ferromagnetic microparticles (such as MNPs) randomly oriented on the diamond 405 surface is observed.

In example experiments on micrometer (μm) size particles, microparticles may be placed on the surface of the diamond chip 405 doped with NV centers. The NV fluorescence may be imaged onto an image sensor 413 at each of several microwave frequencies near the ODMR resonance. From these images, the position of the ODMR peak for each pixel may be recorded. The resulting magnetic field map is presented in FIG. 6. Magnetic dipole field patterns from each individual microparticle may be observed. When the bias field is small, e.g., ~2 mT applied normal to the surface, the magnetic microparticle dipolar patterns may be randomly oriented. Application of the bias field in three of the four possible NV crystallographic orientations may enable reconstruction of the full magnetic field vector. From these data all magnetic anisotropy parameters can be recorded.

Figure 7:
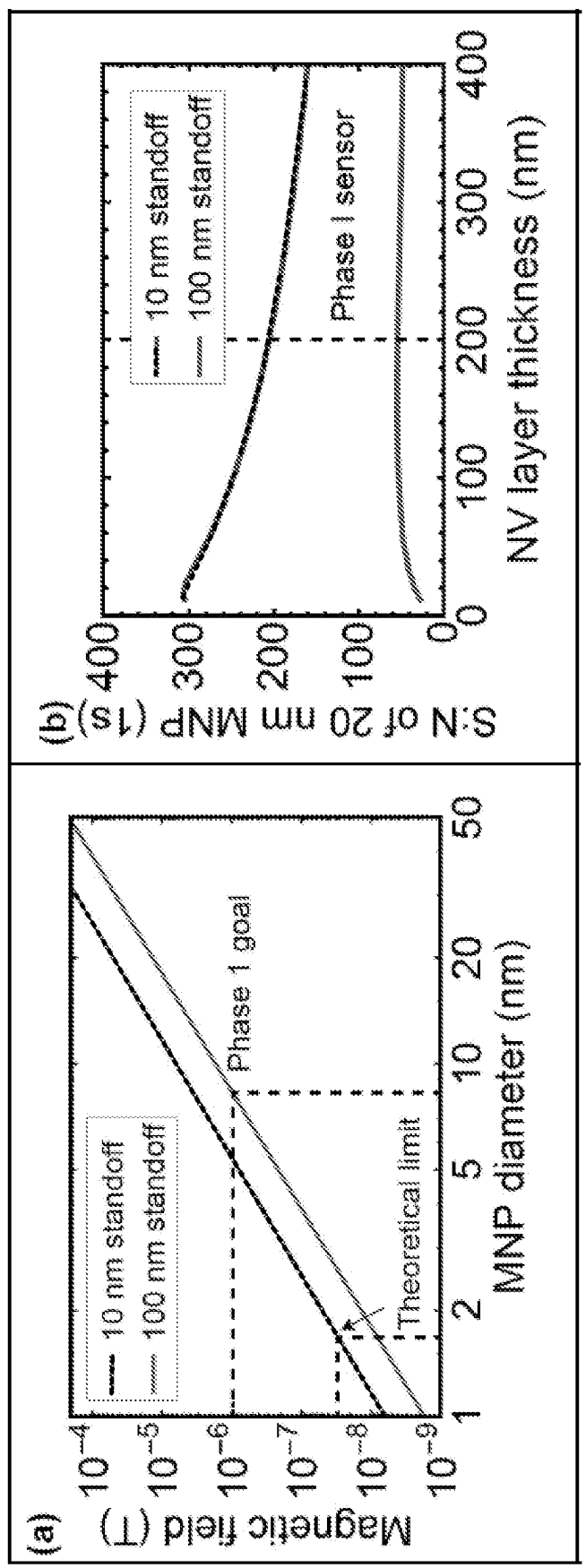
FIG. 7 illustrates example sensitivity calculations

FIG. 7 illustrates example sensor sensitivity calculations. FIG. 7(*a*) illustrates expected magnetic field from a fully-magnetized MNP core comprised of pure $Fe_3O_4$ as a function of MNP core diameter. FIG. 7(*b*) illustrates signal-to-noise of magnetic field measurement for 20 nm MNP as a function of NV sensing volume: 400 nm×400 nm×Z, where Z is the layer thickness. Two scenarios are examined: i) 10 nm standoff (MNPs are directly on diamond) and ii) 100 nm standoff (NV layer and MNP are separated by protective coating or TEM grid membrane), In some example calculations, the magnetic field a distance R from a MNP of uniform magnetization μ is given by:

$$B_{MNP} = 2|\mu|\mu_0 \cos(\theta)/4\pi R^3 \qquad \text{Eq. (1):}$$

where $\mu_0 = 4\pi \times 10^{-7}$ $T^2$ $m^3/J$ is the vacuum permittivity, and θ is the polar angle from the dipole axis. FIG. 7(*a*) plots the expected magnetic field B from a single fully-magnetized MNP, with pure $Fe_3O_4$ core, as a function of its core diameter. The expected field strength is obtained by integrating Eq. (1) over a 400×400×200 nm voxel located above the MNP. It is seen that MNPs with core diameter >10 nm produce fields >1 μT (micro Teslas), which are readily resolved with our magnetic microscope.

In a further example calculation, the minimum detectable field of our NV sensors, in the ideal shot-noise limit, is given by:

$$\delta B = \frac{h}{g\mu_B} \frac{1}{R} \frac{1}{\sqrt{\pi}} \sqrt{\frac{\delta v/\pi}{n_{NV} V t}}, \qquad \text{Eq. (2)}$$

where h=36 μT/MHz, R is the resonance dip contrast, η is the photon collection efficiency, δv is the full-width at half maximum resonance linewidth, $n_{NV}$ is the density of NV centers in a voxel with volume V, and t is the measurement time. Using conservative values (η=0.01, R=0.01, $n_{NV}$=10$^{18}$ cm$^{-3}$, δv=5 MHz), we find δv=0.3 μT for each V=400×400×200 nm$^3$ sensing voxel after t=1 s measurement time. Thus, we believe a sensitivity goal of δB<1 μT is realistic. This corresponds to the expected field from a single MNP with ~9 nm core diameter. In some embodiments, optimized diamond sensing surfaces may potentially be fabricated which exhibit noise floors δB≈10 nT (nano Teslas), corresponding to an MNP core diameter of just 2 nm.

In some embodiments, equations (1) and (2) can be used to identify the ideal NV voxel dimensions. The ideal NV voxel size would maximize the signal to noise from a nearby MNP. The lateral dimensions will be set by the imaging resolution, which is limited by optical diffraction. Dimensions ~400 nm are common in our NV microscopes. The optimal axial dimension can be solved for by calculating the MNP signal-to-noise ratio as a function of layer thickness. Consider detection of a fully-magnetized MNP with a pure 20-nm-diameter pure $Fe_3O_4$ core. The signal is calculated by integrating Eq. (1) over an NV voxel of dimensions nm 400×400×znm$^3$ and dividing by the expected noise floor, calculated using Eq. (2). FIG. 7(b) plots the resulting SNR vs. the layer thickness, z. For a sensor-MNP standoff of 10 nm (essentially no gap between diamond and MNP), the ideal thickness is ~10 nm, but the SNR is only ~30% less for a 200 nm thick layer. For a standoff of 100 nm, a 200 nm layer thickness is nearly optimal. We thus choose a 200 nm thick NV layer 403, as the latter standoff is more realistic if protective films are used (see below) or there is an alignment gap between sensor or sample.

We outline below technical details of example apparatus according to this disclosure, and experimental considerations.

Field of View, FOV: The ideal field of view can be readily calculated based on the number of camera 413 pixels and the optical imaging resolution. When an example sCMOS camera 413, such as the Hamamatsu Orca V2, is used for fluorescence imaging, the camera 413 may contain, e.g., ~4 Megapixels. The optical diffraction limit is ~λ/(2 NA)≈270 nm, where NA≈1.3 is the numerical aperture for an oil-immersion objective 409, and λ≈700 nm is the NV emission wavelength. Since we will be imaging through a ~100 μm diamond 405 and expect other possible imaging aberrations, we select an optical resolution of 400 nm. If we desire that each optical-resolution-limited spot contains 4×4 pixels, then the resulting field of view on the sCMOS sensor will be 200×200 μm$^2$.

Figure 8:
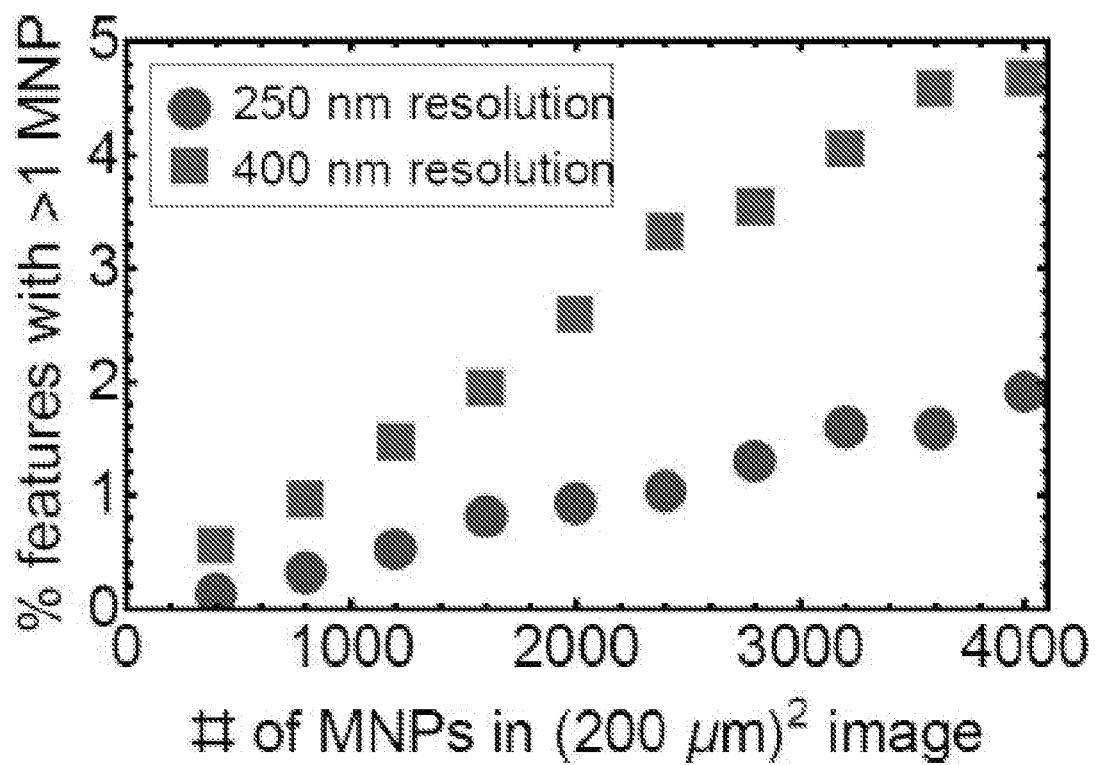
FIG. 8 illustrates example maximum numbers of MNPs per image.

Number of MNPs per FOV: The optimal MNP 402 surface density is the largest one where nearly every individual particle can still be optically resolved. Consider randomly positioned MNPs in the 200×200 μm$^2$ FOV with an optical resolution of 400 nm, as defined above. We define the error rate as the probability that a magnetic feature in the resulting magnetic image contains >1 MNP. This is equivalent to the probability that the nearest MNP is >400 nm away. FIG. 8 plots the error rate as a function of total number of MNPs scattered over the FOV. More than 1,000 individual MNPs 402 can be characterized simultaneously with an error rate less than 1%.

FIG. 8 illustrates an example maximum number of MNPs per image. The error rate, defined as the probability that an MNP's nearest neighbor is <400 nm away, is plotted as a function of the total number of MNPs randomly positioned on a 200×200 μm$^2$ field of view.

Microwave delivery: In some embodiments, such as illustrated in FIG. 4(c), the microwave field produced by MW antenna 401 may be applied by a loop printed on a glass coverslip, which is placed close to the implanted side of the diamond 405. If necessary, the coverslip can also be placed in between the diamond 405 and objective 409 at the expense of a slightly smaller microwave field.

Delivery of excitation light: In some embodiments, optical interrogation of NV centers may be carried out by side illumination with laser beam 408. Excitation light may be delivered at a glancing angle from the side for two reasons i) it reduces the required optical power to create a given excitation intensity within the NV layer 404 and ii) total internal reflection allows to protect the MNPs 402 from heating (when combined with an additional protective layer, see below). In some embodiments, a collimated laser beam 408 with the dimensions 200 μm×40 μm may be incident at an angle ~20 deg with respect to the surface of the diamond 405, so that 200 μm×200 μm spot size of NV doped region is illuminated. Using 1 Watt (W) of laser power, this results in an excitation intensity 1 W/(200 μm×40 μm)=12.5 kW/cm$^2$, which is more than sufficient for NV magnetic microscopy.

Protection against heating: To prevent MNPs 402 from heating due to laser light absorption, protective coatings may be applied without compromising too much on sensor-MNP distance. The green laser light 408 may be coupled into the diamond chip 405 from the side at an angle ~20 deg to the sensing surface 404 of the diamond 405, so the light 408 will undergo the total internal reflection on the diamond-MNP interface. To confine the evanescent coupling of laser light 408 through the diamond surface, embodiments may use ~20-50 nm layer of silver protective coating 403. To further confine a residual evanescent coupling and to separate MNPs 402 from the silver layer 403, embodiments may use a ~20-50 nm layer of sapphire protective coating. We estimate that this can suppress the optical intensity felt by MNPs 402 to a few W/cm$^2$.

NV sensing surface engineering: Any of the below example strategies may be used to create an NV sensing surface layer 404 of desired thickness (e.g., 200 nm-thick) on a diamond chip 405:

A. Start with pure electronic grade diamond ([N]<5 ppb), and implant 15 N+ ions at several different energies. This will create a uniform surface layer of 15 N and lattice vacancies.

B. Start with high pressure high temperature (HPHT) type Ha diamond ([N]~10 ppm) and implant He+ ions to create lattice vacancies.

C. Use a special diamond sample grown by chemical vapor deposition from isotopically purified 12 C material, with in situ 15 N doping and subsequent He+ implantation. This method provides the highest magnetic field sensitivity.

Ion and vacancy distributions can be calculated by using Stopping and Range of Ions in Matter (SRIM) software. After the implantation, the samples may be annealed at 800-1100° C. to promote NV creation while minimizing formation of parasitic paramagnetic spins.

MNP sample preparation techniques: The following example MNP sample preparation techniques may be used in some embodiments, in order to distribute the MNPs 402 on the diamond chip 405 and/or on a substrate layer on the diamond chip 405:

A. Drop cast a dilute MNP suspension in polymethylmethacrylate (PMMA) or similar polymer matrix and bake to harden or allow to dry in air.

B. Spin coat a dilute MNP suspension in polymer matrix and bake or allow to dry.

C. Lithographically define an array of holes with ~800 nm pitch in electron-beam resist. Then disperse MNPs over the mask, allow to settle, and remove the resist. By controlling the MNP concentration, ensure there will be a high probability of 0 or 1 MNP per spot.

D. Apply surface functionalization techniques using biochemistry techniques as are commonly employed in other surface-nanoparticle sensors, such as surface plasmon resonance.

In all the above cases the protective thin layers of silver and sapphire 20-50 nm each may be deposited on the diamond 405 surface, directly above the NV sensing layer 404, to shield MNPs 402 from the laser light (FIG. 9a). In some embodiments, the MNPs 402 may be placed directly on a surface of a diamond chip 405. After each measurement, the diamond chip 405 may be removed from the setup and cleaned in acid.

Figure 9:
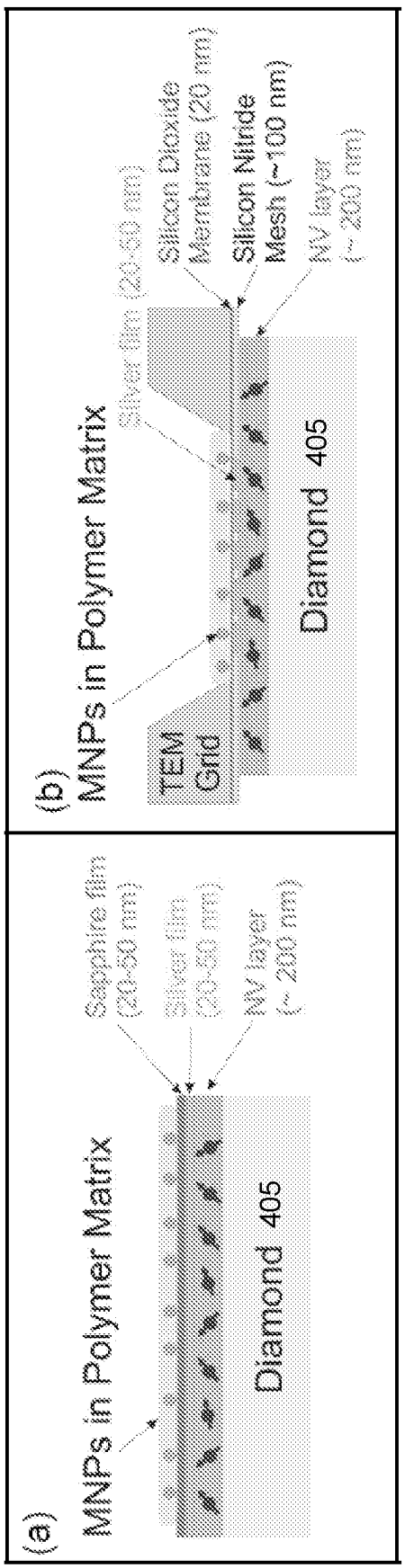
FIG. 9 illustrates example sample loading techniques.

FIG. 9 illustrates example sample loading techniques. FIG. 9(a) illustrates MNPs in a Polymer Matrix placed directly on an imaging sensor comprising the diamond chip 405. Silver and sapphire films may be deposited on a diamond surface, as shown, to protect MNPs from laser heating. FIG. 9(b) illustrates MNPs in a Polymer Matrix placed on TEM grid's silicon dioxide membrane, and a protective silver layer deposited directly on the membrane from the other side.

In embodiments in which MNPs 402 are distributed directly on an imaging sensor comprising the diamond chip 405, techniques disclosed herein may include removing the diamond 405 from the epifluorescence microscope and thorough cleaning afterwards to avoid cross-contamination of samples. Alternatively, in embodiments in which MNPs 402 are distributed on a substrate layer on the diamond chip 405, such as a sacrificial TEM grid, the substrate layer may be used to simplify sample loading/unloading.

The silicon dioxide membrane and TEM grid illustrated in FIG. 9(b) is an example of a substrate layer on the diamond chip 405, upon which the MNPs may be distributed, as an alternative to distributing the MNPs directly on the diamond 405 or on layers adhered to the diamond, e.g., the silver and sapphire layers illustrated in FIG. 9(a). In some embodiments, the silicon dioxide membrane or other substrate layer may be unadhered from the diamond 405, and may therefore be transferrable to other measurement apparatus, such as a TEM microscope.

In some embodiments, MNPs in a polymer matrix may be placed on a $SiO_2$ or SiN membrane of a commercially available TEM grid. In this arrangement, the protective thin silver layer may be deposited on the diamond 405 or directly on the TEM grid's membrane. The TEM grid may be brought in direct contact with NV sensing layer, as illustrated in FIG. 9(b), and may be disposed after each use. In this case no acid cleaning is required, and the diamond sensor 405 can be mechanically fixed to the epifluorescence microscope and need not be removed.

In some embodiments, the disclosed optical magnetic microscope and measurement methods may be used to characterize magnetic properties of individual nanoparticles with high throughput. This is critical in numerous industries ranging from quality control in nanoparticle manufacturing and biomedical applications to research and development and standardization.

In some embodiments, the disclosed technology may be used in connection with manufacturing of super-paramagnetic iron oxide nanoparticles, SP-MNPs. These nanoparticles currently comprise a large portion of the overall MNP market and are of primary interest in biomedical applications, owing to favorable aversion to aggregation and ability to be controlled noninvasively. SP-MNP based technologies may increasingly be applied in drug delivery and biomedical imaging, and in vitro diagnostics. We anticipate this community would benefit from individual nanoparticle characterization, owing to the dependence of SP-MNP magnetic properties on size.

In some embodiments, technologies disclosed herein may be used to make a quantitative analysis of the magnetic properties of individual nanoparticles with high throughput, e.g., 1000 or more particles per 10 minutes. Specifically, our measurement technology provides a quantitative analysis of magnetic properties of single nanoparticles, such as hysteresis loops, magnetic anisotropy, blocking temperature and relaxation time.

In some embodiments, technologies disclosed herein may be incorporate systems and/or operations to sort MNPs 402 which have been characterized according to the disclosed techniques. For example, MNPs may be mechanically sorted by moving the first individual MNP and the second individual MNP into different groups according to properties characterized by magnetization curves. MNPs having one or more measured characteristics may be sorted into a first group, and physically collected into a first group location, while MNPs having one or more other, different measured characteristics may be sorted into a second group, and physically collected into a second group location. For example, microfluidics techniques may be used to control flows of liquids across the diamond chip 405 or the substrate on diamond chip 405. The flows may be controlled to mechanically sort MNPs into the different groups. In some embodiments, sorting MNPs 402 may comprise application of flow cytometry and/or magnetic field gradient control techniques.

Most existing commercially available instruments for magnetometry, such as vibrating sample magnetometer, alternating gradient magnetometer or SQUID are intended for measurements of macroscopic sample volumes. Application of these instruments to nanoparticle samples requires measurement of many particles in an ensemble, complicating a quantitative interpretation of the data and obscuring the distribution of particle properties. More specialized instruments for magnetometry, such as Magnetic Force Microscopy (MFM) or nano-SQUID can resolve single nanoparticles, but the throughput of such measurements is low, limiting the rapid analysis of a large number of individual particles to populate a distribution of properties. Measurement of distributions of magnetic properties is essential to characterize sample heterogeneity for quality control in nanoparticle manufacturing process.

While various embodiments have been disclosed herein, other aspects and embodiments will be apparent to those skilled in art.

The invention claimed is:

1. An apparatus for high throughput characterization of individual Magnetic Nanoparticles (MNPs), the apparatus comprising:

a diamond chip doped with a layer of nitrogen vacancy (NV) color centers;
one thousand or more MNPs, wherein the MNPs are distributed either on the diamond chip or on a substrate layer on the diamond chip;
a laser generator to direct a laser beam at the diamond chip;
a controllable-frequency microwave antenna positioned proximal to the MNPs;
a controllable-strength magnetic field generator positioned to generate a magnetic field at the MNPs;
a camera to record fluorescence images, of fluorescence generated by the NV color centers in response to stimulation by the laser beam, wherein the fluorescence recorded in a fluorescence image is modulated by magnetic resonance of the MNPs, and wherein the magnetic resonance is responsive to stimulation by the controllable-frequency microwave antenna under the magnetic field generated by the controllable-strength magnetic field generator, with the controllable-strength magnetic field generator arranged to modify a magnetic field strength at the MNPs with the camera operable to record additional fluorescence images in response to the modifying of the magnetic field strength; and
a computer having computer readable instructions to perform operations, the operations including operations to use the fluorescence images and the additional fluorescence images to form magnetization curves for at least a first individual MNP and a second individual MNP.

2. The apparatus of claim 1, wherein the camera comprises a sCMOS camera.

3. The apparatus of claim 1, wherein the laser beam comprises a laser beam with a wavelength in the range of 500-600 nanometers.

4. The apparatus of claim 1, wherein the laser beam is directed at a side of the diamond chip at a glancing angle.

5. The apparatus of claim 1, wherein the controllable-strength magnetic field generator is adapted to generate a magnetic field between ±200 mT.

6. The apparatus of claim 1, wherein the layer of NV color centers is about 200 nanometers thick.

7. An apparatus for high throughput characterization of individual Magnetic Nanoparticles (MNPs), the apparatus comprising:
a diamond chip doped with a layer of nitrogen vacancy (NV) color centers;
protective layers of silver and sapphire deposited on the diamond chip;
one thousand or more MNPs, wherein the MNPs are distributed either on the diamond chip or on a substrate layer on the diamond chip;
a laser generator to direct a laser beam at the diamond chip;
a controllable-frequency microwave antenna positioned proximal to the MNPs;
a controllable-strength magnetic field generator positioned to generate a magnetic field at the MNPs;
a camera to record fluorescence images, of fluorescence generated by the NV color centers in response to stimulation by the laser beam, wherein the fluorescence recorded in a fluorescence image is modulated by magnetic resonance of the MNPs, and wherein the magnetic resonance is responsive to stimulation by the controllable-frequency microwave antenna under the magnetic field generated by the controllable-strength magnetic field generator.

8. A method for high throughput characterization of individual Magnetic Nanoparticles (MNPs), comprising:
distributing one thousand or more MNPs on a diamond chip or on a substrate layer positionable on the diamond chip, wherein the diamond chip is doped with a layer of nitrogen vacancy (NV) color centers;
positioning the diamond chip and MNPs, or the substrate layer and MNPs, in an epifluorescence microscope, wherein the epifluorescence microscope comprises a camera or is coupled with a camera; and
recording, by the camera, fluorescence images at multiple different microwave frequencies, wherein the fluorescence images record fluorescence modulated by magnetic resonance of the MNPs, wherein each fluorescence image comprises multiple pixels, and wherein at least a first pixel in each fluorescence image records fluorescence modulated by magnetic resonance of a first individual MNP, and wherein at least a second pixel in each fluorescence image records fluorescence modulated by magnetic resonance of a second individual MNP;
modifying a magnetic field strength at the MNPs;
recording additional fluorescence images in response to modifying the magnetic field strength; and
using the fluorescence images and the additional fluorescence images to form magnetization curves for at least the first individual MNP and the second individual MNP.

9. The method of claim 8, further comprising setting a magnetic field strength for the fluorescence images.

10. The method of claim 8, further comprising calculating a resonant microwave frequency, and wherein the multiple different microwave frequencies comprise microwave frequencies above and below the resonant microwave frequency.

11. The method of claim 8, further comprising creating a magnetic field map from the fluorescence images.

12. The method of claim 11, further comprising identifying isolated magnetic features in the magnetic field map in order to identify individual MNPs.

13. The method of claim 8, wherein modifying the magnetic field strength includes sweeping a magnetic field in small increments between a negative of a maximum value and the maximum value.

14. The method of claim 8, further comprising using the magnetization curves to populate a histogram of coercivity, remanent magnetization, or saturation magnetization of the first individual MNP or the second individual MNP.

15. The method of claim 8, further comprising mechanically sorting the first individual MNP and the second individual MNP into different groups according to properties characterized by the magnetization curves.

16. The method of claim 8, wherein the fluorescence images comprise a field of view of about 200×200 micrometers.

17. A method for high throughput characterization of individual Magnetic Nanoparticles (MNPs), comprising:
distributing one thousand or more MNPs on a diamond chip or on a substrate layer positionable on the diamond chip, wherein the diamond chip is doped with a layer of nitrogen vacancy (NV) color; centers, wherein distributing the MNPs comprises:
drop casting a dilute MNP suspension in polymethylmethacrylate (PMMA);
spin coating a dilute MNP suspension in a polymer matrix; or lithographically defining an array of holes in a mask, dispersing MNPs over the mask, and removing the mask;

positioning the diamond chip and MNPs, or the substrate layer and MNPs, in an epifluorescence microscope, wherein the epifluorescence microscope comprises a camera or is coupled with a camera; and recording, by the camera, fluorescence images at multiple different microwave frequencies, wherein the fluorescence images record fluorescence modulated by magnetic resonance of the MNPs, wherein each fluorescence image comprises multiple pixels, and wherein at least a first pixel in each fluorescence image records fluorescence modulated by magnetic resonance of a first individual MNP, and wherein at least a second pixel in each fluorescence image records fluorescence modulated by magnetic resonance of a second individual MNP.

\* \* \* \* \*

UNITED STATES PATENT AND TRADEMARK OFFICE
CERTIFICATE OF CORRECTION

PATENT NO. : 10,875,766 B2
APPLICATION NO. : 16/343590
DATED : December 29, 2020
INVENTOR(S) : Acosta et al.

Page 1 of 1

It is certified that error appears in the above-identified patent and that said Letters Patent is hereby corrected as shown below:

In the Claims

In Column 14, Line 62, in Claim 17, delete "color;" and insert --color-- therefor Signed and Sealed this
Twenty-third Day of March, 2021

Drew Hirshfeld
*Performing the Functions and Duties of the*
*Under Secretary of Commerce for Intellectual Property and*
*Director of the United States Patent and Trademark Office*